United States Patent [19]
Kim et al.

[11] Patent Number: 6,108,261
[45] Date of Patent: Aug. 22, 2000

[54] REPAIR CIRCUIT FOR REDUNDANCY CIRCUIT WITH ANTI-FUSE

[75] Inventors: Young-Hee Kim, Pahang-shi; Kie-Bong Ku, Yicheon-shi, both of Rep. of Korea

[73] Assignee: Hyundai Electronics Industries Co., Ltd., Gyunggi-do, Rep. of Korea

[21] Appl. No.: 09/342,509

[22] Filed: Jun. 29, 1999

[30] Foreign Application Priority Data

Jun. 30, 1998 [KR] Rep. of Korea ..................... 98-26222

[51] Int. Cl.$^7$ ................................................ G11C 7/00
[52] U.S. Cl. ....................................... 365/225.7; 365/200
[58] Field of Search ................................. 365/200, 225.7

[56] References Cited

U.S. PATENT DOCUMENTS 5,724,282  3/1998  Loughmiller et al. ............... 365/225.7
5,838,625  11/1998  Cutter et al. ........................... 365/225.7
5,856,950  1/1999  Cutter et al. ........................... 365/225.7
5,859,562  1/1999  McColumn ........................... 365/225.7

FOREIGN PATENT DOCUMENTS 6-295593  10/1994  Japan .

*Primary Examiner*—Son T. Dinh
*Attorney, Agent, or Firm*—Oliff & Berridge, PLC

[57] ABSTRACT

A repair circuit for a redundancy circuit which replaces a failed circuit with the redundancy circuit using a fuse, wherein the fuse is an anti-fuse programmed by its conduction due to a dielectric breakdown. A repair operation can be performed at a package step of a memory device, by using the anti-fuse conducting due to the dielectric breakdown.

11 Claims, 3 Drawing Sheets

1

REPAIR CIRCUIT FOR REDUNDANCY CIRCUIT WITH ANTI-FUSE

BACKGROUND OF THE INVENTION

1. Field of the Invention

The present invention relates in general to a repair circuit for a redundancy circuit for performing a repair operation to replace a failed circuit with the redundancy circuit in a manufacturing process of a memory device, and more particularly to a repair circuit for a redundancy circuit which uses an anti-fuse rather than a conventional fuse, to perform a repair operation at a package step of the memory device.

2. Discussion of the Related Art

Generally, a memory device such as a dynamic random access memory (DRAM) device comprises a large number of minute memory cells and cannot perform its function when any one of the memory cells fails. In this case, the DRAM device is regarded as an inferior article to be discarded. Meanwhile, the integration degree of a DRAM device is on an increasing trend and only a smaller number of memory cells therein thus have a high probability of failing. However, the discarding of a failed DRAM device is inefficient in that doing so reduces yield. In order to increase the yield, a redundancy circuit is preliminarily arranged in a DRAM device in such a manner that a failed memory cell can be replaced with a redundancy memory cell therein. The arrangement of such a redundancy circuit may cause problems such as an increase in chip area and an increase in the number of failure repairing tests. However, the redundancy circuit has been adopted by DRAM devices, actively beginning with 64K–256K devices, because such use results in little increase in DRAM chip areas DRAMS.

The redundancy circuit is arranged correspondingly to each sub-array block and has spare row and column stages which are driven to replace a failed memory cell with a redundancy memory cell. If a wafer process is completed, failed memory cells are detected through a testing process and the associated addresses are replaced with addresses of spare memory cells. At this time, an internal circuit is adapted to perform a programming operation of replacing the addresses of the failed memory cells with those of the spare memory cells. In practice, upon receiving an address corresponding to a failed line, the internal circuit replaces the failed line with a spare line. In order to perform the programming operation, there have been proposed various methods, for example, an electrical fuse method of applying an overcurrent to a fuse to open the fuse by melting, a laser cutting method of applying a laser beam to a fuse to open the fuse by burning, a method of interconnecting junctions using a laser beam, and a method of storing an associated program in an erasable programmable read only memory (EPROM). Among the above methods, the laser cutting method is widely used because it is simple, reliable and easy to lay out. In this case, the fuse is made of a polysilicon wire or metal wire.

FIG. 1 is a circuit diagram showing the construction of a conventional repair circuit which repairs a failed circuit using a general fuse.

With reference to FIG. 1, an operation switching part 10' is adapted to precharge the entire circuit with a source voltage VCC in response to a complementary precharge signal prechb. A sense signal input part 20' is connected between the operation switching part 10' and ground through a fuse PF. The sense signal input part 20' is turned on in response to an address signal ADDR of a failed circuit to sense a blown state of the fuse PF. An output part 30' is adapted to output a voltage value at a common connection point of the operation switching part 10' and one side of the fuse PF. A latch part 80' is adapted to stabilize an output value from the output part 30' when the fuse PF is programmed.

The operation of the conventional repair circuit with the above-mentioned construction will hereinafter be described briefly.

If the complementary precharge signal prechb becomes low in level at a normal state, the operation switching part 10' is turned on to apply the source voltage VCC to the fuse PF. Upon inputting the address signal ADDR under this precharged condition, the sense signal input part 20' is turned on, resulting in the forming of a current path where current of the source voltage VCC from the operation switching part 10' flows to ground through the fuse PF and sense signal input part 20'. As a result, the voltage across the fuse PF becomes low in level. This low level voltage is inverted by an inverter in the output part 30', thus making a complementary repair value repb high in level at the normal state.

When the fuse PF (for example, a polysilicon fuse) is cut by a laser beam under the above condition, the current path, previously formed from the operation switching part 10' to ground through the fuse PF and sense signal input part 20', is blocked to make the voltage at one terminal of the fuse PF high in level. This high level voltage is inverted by the inverter in the output part 30', thus making the complementary repair value repb low in level. This complementary repair value repb is fed back to the latch part 80' to turn on a PMOS transistor therein. As a result, the source voltage VCC is transferred to the output part 30', so that the output value therefrom can be maintained stably even if the complementary precharge signal prechb is not input.

The complementary repair value repb is applied to replace a failed circuit with a redundancy circuit to effect a normal operation.

On the other hand, among the above-mentioned methods, the overcurrent cutting method requires a high current driver and fuse-blowing pad, resulting in an increase in occupying area. Further, in the case of cutting polysilicon using a laser beam, an error may occur in accurately applying the laser beam to the polysilicon and a residue may be present after the cutting. In this case, the laser cutting method requires a large amount of processing time and is inaccurate and difficult to perform. Further, the repair is impossible at a package level, resulting in a degradation in reliability.

In order to solve the above problems, there has recently been proposed a new element, or a so-called anti-fuse, which can be programmed simply even at the package level.

The anti-fuse is programmed to interconnect an upper electrode and lower electrode. Namely, the anti-fuse includes an insulating film formed between the upper and lower electrodes in such a manner that the film can easily be broken down according to a dielectric breakdown voltage, which is a voltage difference between the upper and lower electrodes.

In this regard, the anti-fuse is programmed to interconnect the two electrodes, whereas a general fuse is programmed to disconnect the electrodes from each other.

As a result, there is a need for a circuit which is capable of programming the anti-fuse and verifying the programmed result of the anti-fuse.

SUMMARY OF THE INVENTION

Therefore, the present invention has been made in view of the above problems, and it is an object of the present invention to provide a repair circuit for a redundancy circuit which is capable of performing a repair operation even at a package level of a memory device, using an anti-fuse which is programmed to interconnect an upper electrode and lower electrode due to a dielectric breakdown of an insulating film formed between the upper and lower electrodes, based on a voltage difference therebetween.

In accordance with the present invention, the above and other objects can be accomplished by a provision of a repair circuit for a redundancy circuit which replaces a failed circuit with the redundancy circuit using a fuse, wherein the fuse is an anti-fuse programmed by its conduction due to a dielectric breakdown.

The anti-fuse remains an insulated barrier, i.e., an electrical open, at a low voltage level and conducts, i.e., becomes an electrical short due to the dielectric breakdown upon application of a high voltage thereto.

The repair circuit for the redundancy circuit comprises an anti-fuse programming circuit including operation switching means for precharging the anti-fuse programming circuit with a half voltage; sense signal input means for inputting a sense signal to verify a programmed state of the anti-fuse; breakdown voltage supply means for supplying a source voltage for the dielectric breakdown of the anti-fuse; output means for outputting a repair signal indicative of the programmed state of the anti-fuse in response to the input sense signal; feedback means for feeding back the output signal from the output means at low power; current blocking means for blocking a current path from the breakdown voltage supply means to the anti-fuse in response to a first control signal from the feedback means; reverse current prevention means for blocking the flow of current from the feedback means to the output means; and latch means for strongly stabilizing the anti-fuse at the level of the half voltage in response to a second control signal from the output means.

At a normal state, i.e., where no programming signal is input, the operation switching means supplies the half voltage to the anti-fuse programming circuit to precharge it with the half voltage. The half voltage is strongly stabilized by the latch means even when the precharge voltage is unstable.

If the programming signal is input to program the anti-fuse under the above precharged condition, the breakdown voltage supply means supplies the source voltage to the anti-fuse for the dielectric breakdown thereof.

If the sense signal is input via by the sense signal input means to verify the programmed state of the anti-fuse under the condition that the anti-fuse is programmed in the above manner, the output means outputs the repair signal indicative of the dielectric breakdown state of the anti-fuse.

The dielectric breakdown of the anti-fuse may result in the forming of a current path from the breakdown voltage supply means to the anti-fuse. At this time, the current blocking means functions to block such a current path in response to the first control signal from the feedback means to prevent further current consumption.

The feedback means functions to forcefully control the current blocking means, thereby allowing the current blocking means to block the current path quickly at low power. The reverse current prevention means functions to block the flow of current from the feedback means to the output means.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
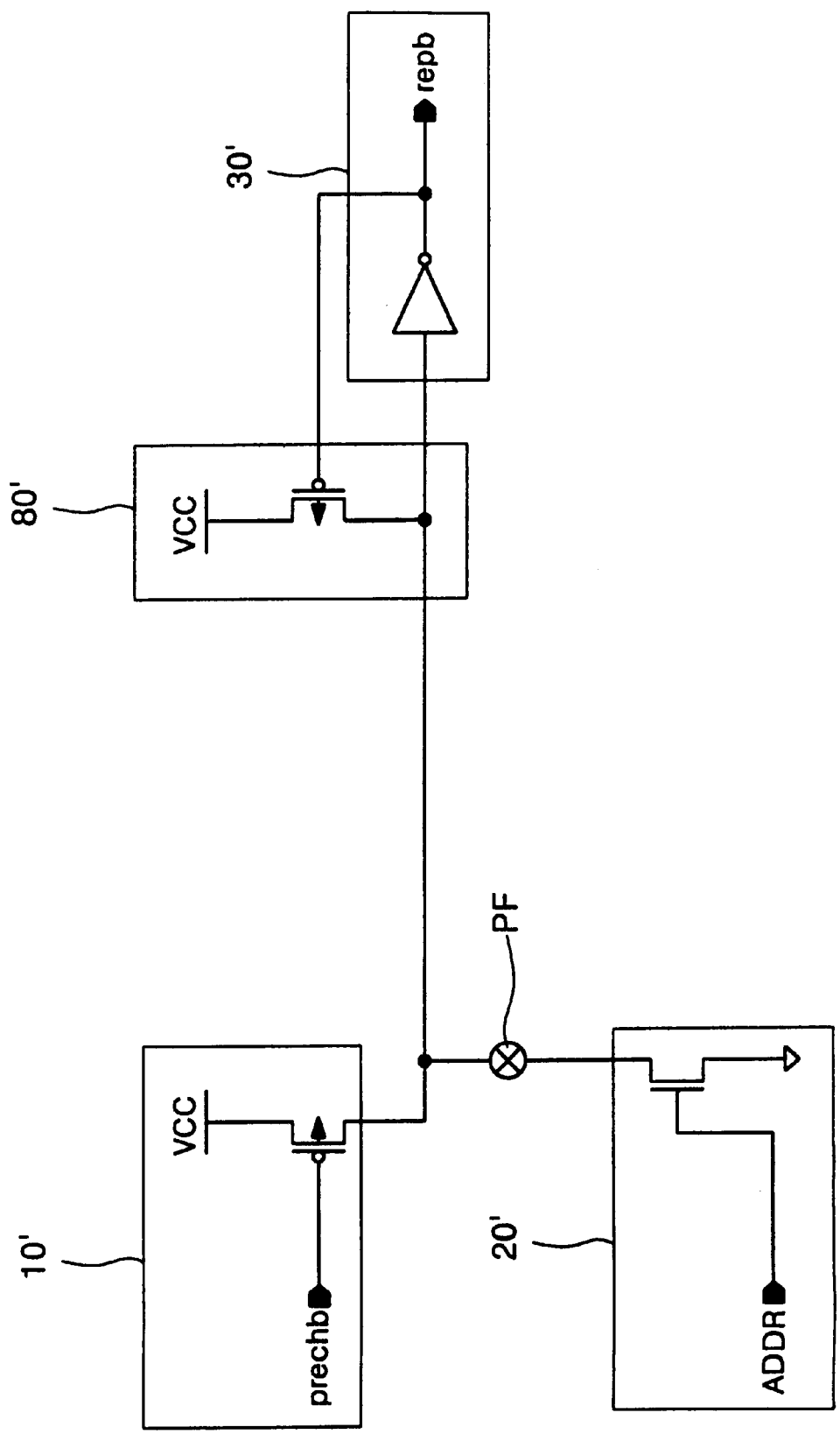
FIG. 1 is a circuit diagram showing the construction of a conventional repair circuit for a redundancy circuit using a conventional fuse.
Figure 2:
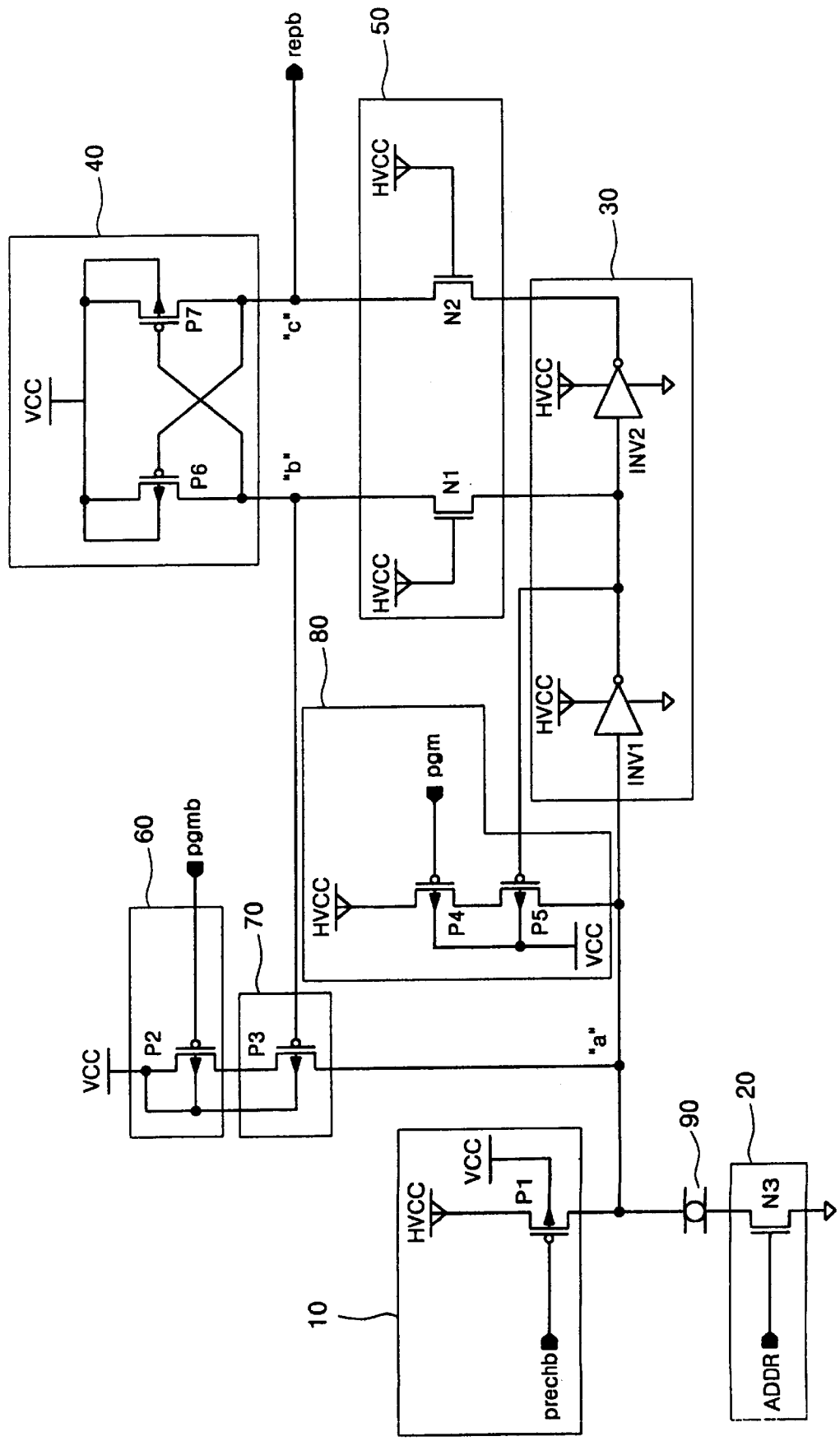
FIG. 2 is a circuit diagram showing the construction of a repair circuit for a redundancy circuit using an anti-fuse in accordance with the present invention.

FIG. 2 is a circuit diagram showing the construction of a repair circuit for a redundancy circuit using an anti-fuse in accordance with an embodiment of the present invention.

With reference to FIG. 2, an operation switching part 10 is adapted to precharge an anti-fuse programming circuit using a half voltage HVCC. To this end, the operation switching part 10 is provided with a first PMOS transistor P1.

The first PMOS transistor P1 has its drain connected to the half voltage HVCC, its source connected to one side of an anti-fuse 90, and a gate for inputting a complementary precharge signal prechb.

A common connection point of the one side of the anti-fuse 90 and the source of the first PMOS transistor P1 will be referred to hereinafter as a node 'a'.

A sense signal input part 20 includes a third NMOS transistor N3 having its drain connected to the other side of the anti-fuse 90, its source connected to a ground voltage terminal, and a gate for inputting a failed address signal ADDR as a sense signal.

An output part 30 includes a first inverter INV1 for inverting a signal at the node a, and a second inverter INV2 for inverting an output signal from the first inverter INV1.

The first and second inverters INV1 and INV2 are enabled by the half voltage HVCC and the output of the output part 30, as well as the output of the second inverter INV2, thus have the level of the half voltage HVCC when a logic high is output therefrom.

A feedback part 40 includes a cross-coupled feedback loop which is operated by a source voltage VCC to rapidly feed back a variation in an output voltage repb from the anti-fuse programming circuit. To this end, the cross-coupled feedback loop is provided with sixth and seventh PMOS transistors P6 and P7. The sixth PMOS transistor P6 has its drain connected to the source voltage VCC and its gate connected to a source of the seventh PMOS transistor P7. The seventh PMOS transistor P7 has its drain connected to the source voltage VCC and its gate connected to a source of the sixth PMOS transistor P6. The source of the sixth PMOS transistor P6 is also connected to an output terminal of the first inverter INV1 via a first NMOS transistor N1, and the source of the seventh PMOS transistor P7 is also connected to an output terminal of the second inverter INV2 via a second NMOS transistor N2.

Hereinafter, a common connection point of the source of the sixth PMOS transistor P6 and a drain of the first NMOS transistor N1 will be referred to as a node 'b' and a common connection point of the source of the seventh PMOS transistor P7 and a drain of the second NMOS transistor N2 will be referred to as a node 'c'.

The first and second NMOS transistors N1 and N2 constitute a reverse current prevention part 50. To this end, the first and second NMOS transistors N1 and N2 are connected to the half voltage HVCC at their gates and therefore always remain on.

If the source voltage VCC is applied respectively to the nodes b and c, current paths are formed from the nodes b and c to the first and second inverters INV1 and INV2, respectively, thereby introducing reverse current thereto. However, because the first and second NMOS transistors N1 and N2 remain turned on by the half voltage HVCC, the amounts of current flowing therethrough correspond to respective differences between the half voltage HVCC and their respective threshold voltages. As a result, current can be prevented from reversely flowing.

A breakdown voltage supply part 60 is operated in response to a complementary programming signal pgmb to supply the source voltage VCC to the node a. To this end, the breakdown voltage supply part 60 is provided with a second PMOS transistor P2.

A current blocking part 70 is adapted to interrupt a breakdown voltage for the anti-fuse 90, which is the source voltage VCC supplied from the breakdown voltage supply part 60, to thereby block a current path from the breakdown voltage supply part 60 to the anti-fuse 90 formed once the anti-fuse 90 is programmed. To this end, the current blocking part 70 is provided with a third PMOS transistor P3.

The second PMOS transistor P2 in the breakdown voltage supply part 60 has its drain connected to the source voltage VCC, its source connected to a drain of the third PMOS transistor P3 in the current blocking part 70 and a gate for inputting the complementary programming signal pgmb. The third PMOS transistor P3 has its source connected to the node a and its gate connected to the node b, to be operated by the source voltage VCC.

A latch part 80 is adapted to stabilize a voltage level at the node a to prevent the output of the anti-fuse programming circuit from varying in level due to an instability of that voltage level. To this end, the latch part 80 is provided with a fourth PMOS transistor P4 operated in response to a programming signal pgm, and a fifth PMOS transistor P5 operated in response to the output signal from the first inverter INV1. The fourth PMOS transistor P4 has its drain connected to the half voltage HVCC and its source connected to a drain of the fifth PMOS transistor P5. The fifth PMOS transistor P5 has its source connected to the node a.

At a normal state, the programming signal pgm is low in level and the fourth PMOS transistor P4 is thus turned on. Also, the node a is precharged with the half voltage HVCC in response to the complementary precharge signal prechb, and the output of the first inverter INV1 thus goes low in level. As a result, the fifth PMOS transistor P5 is turned on to supply the half voltage HVCC to the node a, thereby stabilizing the voltage level at the node a.

If the programming signal pgm goes from low to high in level to program the anti-fuse 90, the fourth PMOS transistor P4. The fifth PMOS transistor P5 is also turned off, because the output of the first inverter INV1 is changed from low to high in level when the anti-fuse 90 is programmed. As a result, the fourth and fifth PMOS transistors P4 and P5 function to block a current path where current of the source voltage VCC, which is applied to the node a to program the anti-fuse 90, flows to the half voltage terminal (HVCC).

The output repb of the anti-fuse programming circuit is provided at the node c to verify the programmed state of the anti-fuse 90.

Figure 3:
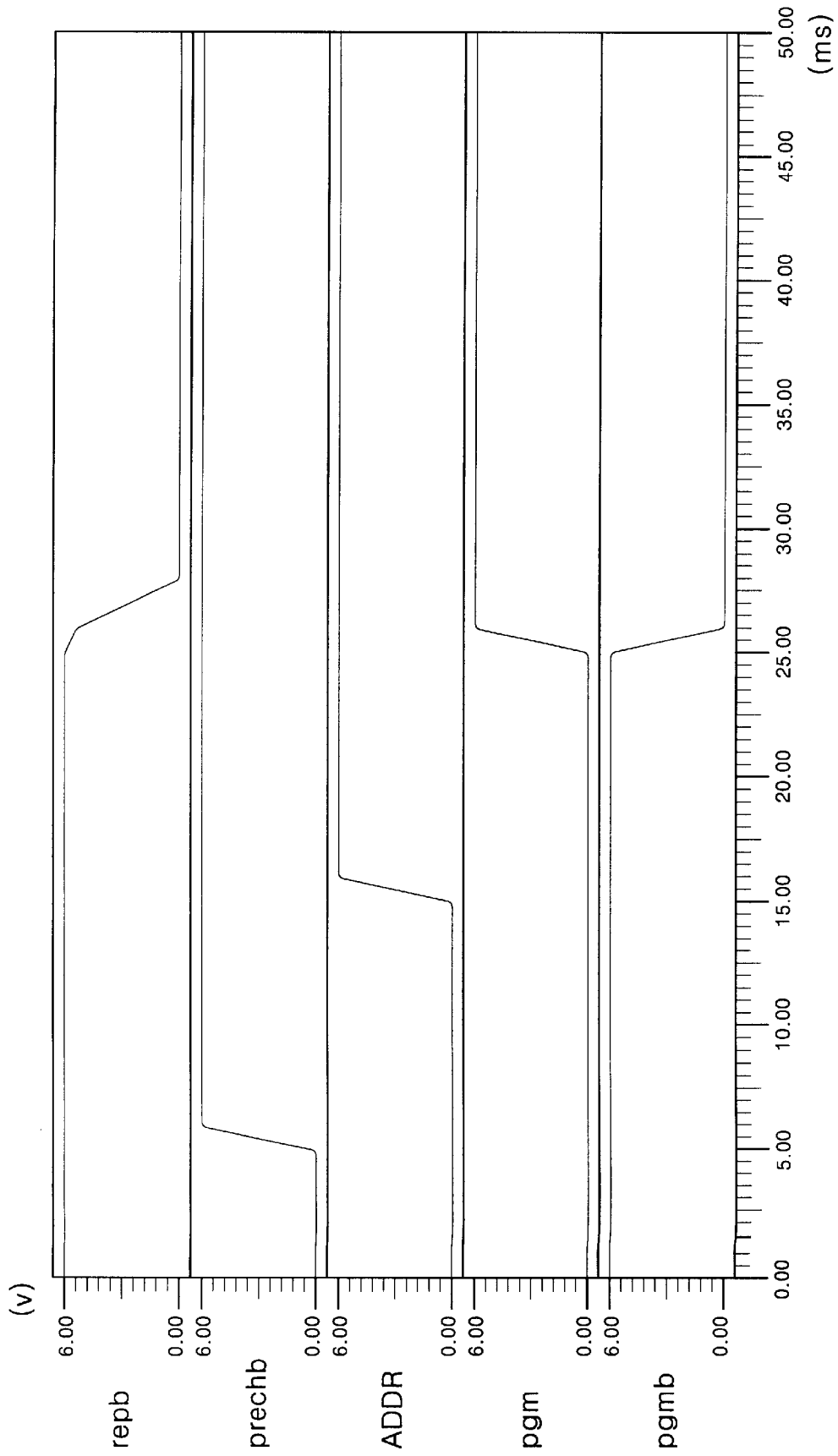
FIG. 3 is a graph showing the simulated results of input/output signals of the repair circuit shown in FIG. 2.

FIG. 3 is a graph showing the simulated results of the input/output signals in the repair circuit in FIG. 2.

The operation of the repair circuit with the above-mentioned construction in accordance with the present invention will hereinafter be described in detail with reference to FIG. 3.

First, at the normal state, the complementary precharge signal prechb becomes low in level to precharge the anti-fuse programming circuit, thereby causing the first PMOS transistor P1 in the operation switching part 10 to be turned on to supply the half voltage HVCC to the node a. As a result, the anti-fuse programming circuit is precharged with the half voltage HVCC.

Then, in the output part 30, the half voltage HVCC at the node a is inverted from high to low in level by the first inverter INV1 and again inverted from low to high in level by the second inverter INV2. As a result, the node b becomes low in level and the node c becomes high in level.

In the feedback part 40, because the node b becomes low in level, the seventh PMOS transistor P7 is turned on to transfer the source voltage VCC to the node c, resulting in the output voltage repb becoming high in level. Also, because the node c becomes high in level, the sixth PMOS transistor P6 is strongly turned off, resulting in the node b remaining low in level. This low level voltage at the node b is applied to the gate of the third PMOS transistor P3 in the current blocking part 70, thereby causing the third PMOS transistor P3 to remain turned on.

In the latch part 80, the precharged voltage, which is the half voltage HVCC, at the node a is inverted from high to low in level by the first inverter INV1 and then applied to the gate of the fifth PMOS transistor P5, thereby causing the fifth PMOS transistor P5 to remain turned on.

If the complementary precharge signal prechb goes high in level and the failed address signal ADDR goes high in level under the above precharged condition, the third NMOS transistor N3 is turned on. However, because the programming signal pgm is still low in level, there is no dielectric breakdown in the anti-fuse 90 and the node a is thus not changed in voltage level.

Thereafter, when the programming signal pgm goes high in level to program the anti-fuse 90, the fourth PMOS transistor P4 in the latch part 80 is turned off to block the supply of the half voltage HVCC to the node a. Because the complementary programming signal pgmb becomes low in level, the second PMOS transistor P2 in the breakdown voltage supply part 60 is turned on to supply the source voltage VCC to the node a through the third PMOS transistor P3. As a result, a current path is formed from the node a to ground through the anti-fuse 90 and the turned-on third NMOS transistor N3, thus causing a dielectric breakdown which programs the anti-fuse 90.

If the dielectric breakdown occurs in the anti-fuse 90 in the above manner, the node a is changed from high to low in level and then inverted from low to high in level by the first inverter INV1. This high level output of the first inverter INV1 is transferred to the node b through the first NMOS transistor N1. The fifth PMOS transistor P5 is turned off in response to the high level output of the first inverter INV1 to prevent current from reversely flowing due to the source voltage VCC at the node a.

Further, the high level voltage at the node b turns off the third PMOS transistor P3, which was previously turned on to supply the source voltage VCC to the node a through the breakdown voltage supply part 60. As a result, the current path resulting from the programming of the anti-fuse 90 is blocked so that no further current can flow therethrough.

The third PMOS transistor P3 is strongly turned off by the source voltage VCC from the feedback part 40. As a result, the feedback part 40 functions to rapidly turn off the third PMOS transistor P3 and maintain it stability.

If the anti-fuse 90 is programmed due to the dielectric breakdown in the above manner, the node a becomes low in level according to the turning-on of the third NMOS transistor N3. This low level voltage at the node a is inverted high by the first inverter INV1 and then inverted low by the second inverter INV2. This low level output of the second inverter INV2 is transferred to the node c, resulting in the output voltage repb becoming low in level.

The low level voltage at the node c turns on the sixth PMOS transistor P6 to make the node b high in level. As a result, the seventh PMOS transistor P7 is turned off to maintain the output of the second inverter INV2. In this manner, the output value of the anti-fuse programming circuit is rapidly stabilized and the current blocking part 70 is operated more forcefully by the source voltage VCC from the feedback part 40 than by the half voltage HVCC from the second inverter INV2, thus preventing current consumption.

In this manner, the anti-fuse is used to repair a failed circuit at a package step of a memory device while consuming a small amount of current.

As apparent from the above description, according to the present invention, the repair operation is performed to replace a failed circuit with a redundancy circuit in a manufacturing process of a memory device. In particular, the repair operation can be performed at a package step of the memory device, resulting in an increase in yield.

Further, the source-voltage-driven cross-coupled feedback loop is provided in the output part of the repair circuit. Therefore, the current path formed after the anti-fuse is programmed can be blocked quickly and at low power, resulting in a significant reduction in current (power) consumption.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A repair circuit for a redundancy circuit which replaces a failed circuit with said redundancy circuit using an anti-fuse programmed by its conduction due to a dielectric breakdown voltage applied to said anti-fuse, wherein said repair circuit is adapted to replace said failed circuit with said redundancy circuit according to a programmed state of said anti-fuse said repair circuit comprising:

an anti-fuse programming circuit for generating a repair signal indicative of the programmed state of said anti-fuse and having a feedback part to inhibit said dielectric breakdown voltage immediately after programming said anti-fuse said dielectric breakdown voltage being inhibited based on said repair signal indicative of the programmed state of said anti-fuse.

2. The repair circuit for a redundancy circuit as set forth in claim 1, wherein said anti-fuse programming circuit having said feedback part comprises:

operation switching means, connected to said anti-fuse, for precharging said anti-fuse programming circuit with a half voltage level, said anti-fuse being subjected to dielectric breakdown when supplied with an overcurrent;

sense signal input means for inputting a sense signal to verify the programmed state of said anti-fuse;

breakdown voltage supply means for supplying a source voltage for the dielectric breakdown of said anti-fuse;

output means, connected to said feedback part, for outputting said repair signal indicative of the programmed state of said anti-fuse in response to said input sense signal, wherein said feedback part generates a first control signal based on said repair signal; and current blocking means for blocking a current path from said breakdown voltage supply means to said anti-fuse in response to the first control signal.

3. The repair circuit for a redundancy circuit as set forth in claim 2, wherein said operation switching means includes a PMOS transistor connected between a half voltage terminal receiving the half voltage level and said anti-fuse, said PMOS transistor being operated in response to a precharge signal.

4. The repair circuit for a redundancy circuit as set forth in claim 2, wherein said sense signal input means includes an NMOS transistor connected between said anti-fuse and ground, said NMOS transistor being operated in response to said sense signal.

5. The repair circuit for a redundancy circuit as set forth in claim 2, wherein said breakdown voltage supply means includes a PMOS transistor connected between a source voltage terminal and said current blocking means, said PMOS transistor being operated in response to a programming signal.

6. The repair circuit for a redundancy circuit as set forth in claim 2, wherein said output means includes:

a first inverter connected to said anti-fuse, said first inverter being enabled by said half voltage level to invert an output signal from said anti-fuse and output the inverted signal; and a second inverter enabled by said half voltage level to invert the output from said first inverter and to output the inverted signal as said re air signal indicative of the programmed state of said anti-fuse.

7. The repair circuit for a redundancy circuit as set forth in claim 2, wherein said current blocking means includes a PMOS transistor connected between an output terminal of said breakdown voltage supply means and said anti-fuse, said PMOS transistor being operated in response to said first control signal.

8. The repair circuit for a redundancy circuit as set forth in claim 2, wherein said feedback part includes a cross-coupled feedback loop operated by said source voltage to maintain a half voltage output from said output means.

9. The repair circuit for a redundancy circuit as set forth in claim 2, further comprising:

reverse current prevention means for blocking a flow of current from said feedback part to said output means; and latch means for stabilizing said anti-fuse at the half voltage level in response to a second control signal output from said output means.

10. The repair circuit for a redundancy circuit as set forth in claim 9, wherein said reverse current prevention means includes at least one transistor operated by said half voltage level to prevent an output voltage from said feedback means from being transferred to said output means.

11. The repair circuit for a redundancy circuit as set forth in claim 9, wherein said latch means includes:

a first PMOS transistor operated in response to a programming signal to supply said half voltage level to said anti-fuse; and a second PMOS transistor connected in series to said first PMOS transistor, said second PMOS transistor controlling a current path from said anti-fuse to a half voltage terminal receiving the half voltage level in response to a second control signal output from said output means.

* * * * *